United States Patent [19]

Mihara

[11] Patent Number: 5,471,363
[45] Date of Patent: Nov. 28, 1995

[54] FERROELECTRIC CAPACITIVE ELEMENT

[75] Inventor: Takashi Mihara, Iruma, Japan

[73] Assignees: Olympus Optical Co., Ltd., Tokyo, Japan; Symetrix Corporation, Colorado Springs, Colo.

[21] Appl. No.: 308,647

[22] Filed: Sep. 19, 1994

[30] Foreign Application Priority Data

Sep. 22, 1993 [JP] Japan ................... 5-235330

[51] Int. Cl.$^6$ ................... H01G 4/008
[52] U.S. Cl. ................... 361/305; 361/321.1; 361/303
[58] Field of Search ................... 361/303–305, 361/320–321.5; 365/145, 149; 257/751, 752, 757, 765, 771, 295, 297; 29/303, 306, 25.42

[56] References Cited

U.S. PATENT DOCUMENTS

| | | | |
|---|---|---|---|
| 5,142,437 | 8/1992 | Kammerdiner | 361/313 |
| 5,164,808 | 11/1992 | Evans, Jr. | 361/305 |
| 5,293,510 | 3/1994 | Takenaka | 257/295 |
| 5,368,915 | 11/1994 | Ueda | 361/311 |

FOREIGN PATENT DOCUMENTS

| | | |
|---|---|---|
| 0495114A1 | 7/1992 | European Pat. Off. . |
| 2-248089 | 10/1990 | Japan . |
| 4-85878 | 3/1992 | Japan . |
| 4-206869 | 7/1992 | Japan . |

*Primary Examiner*—Mark H. Paschall
*Assistant Examiner*—Michael D. Switzer
*Attorney, Agent, or Firm*—Frishauf, Holtz, Goodman, Langer & Chick

[57] ABSTRACT

A ferroelectric capacitive element according to the present invention includes a substrate constituted by a silicon oxide, glass, or the like, an adhesive layer of Ti or the like formed on the substrate, a lower electrode formed on the adhesive layer and constituted by any one of Pt, Pd, Ag, Au and the like, a ferroelectric film 14 formed on the lower electrode, a conductive oxide film formed on the ferroelectric film, and an upper electrode formed on the conductive oxide film and constituted by a metallic material other than precious metal, such as Al, Al alloy, AlSi, AlNi, Ni alloy, Cu alloy, AlCu.

12 Claims, 3 Drawing Sheets

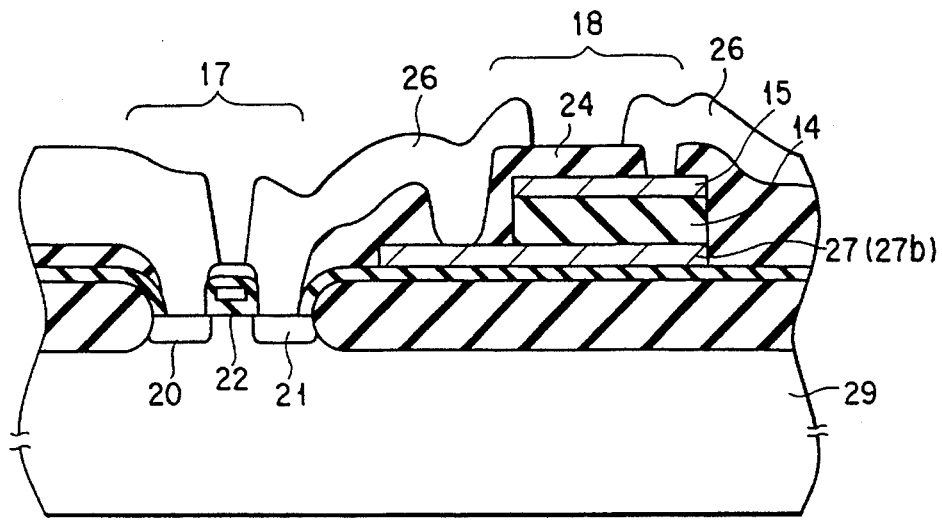
F I G. 7

FERROELECTRIC CAPACITIVE ELEMENT

BACKGROUND OF THE INVENTION

1. Field of the Invention

The present invention relates to a ferroelectric memory device, a semiconductor memory device, and the like to which a ferroelectric capacitive element is applied.

2. Description of the Related Art

Recently, various techniques of applying a capacitive element (capacitor) using a ferroelectric thin film to a semiconductor memory device and an electronic device, have been known to public.

When the ferroelectric thin film is used as a capacitive element, it is usually important to utilize the characteristics of the thin film with efficiency. More specifically, the ferroelectric thin film has to be formed such that it has the characteristics of increasing the residual polarization, reducing the dielectric constant, lowering the resistant voltage, lengthening the retaining time, resisting the repetitive inversion of polarization, and the like, and these characteristics have to be unchanged in the integration process.

The above characteristics vary with materials of electrodes, conditions of interface, crystal layer of ferroelectrics, size of grains, etc. In particular, if, as shown in FIG. 8A, an adhesive layer 2, a lower electrode layer 3, a ferroelectric thin film 4, and an upper electrode layer 5 are formed in this order on a substrate 1, platinum (Pt), gold (Au), palladium (Pd), or the like is used for the materials of the electrode layers in order to prevent them from being oxidized, since there is a step of thermally treating the ferroelectric thin film 4 in an oxygen atmosphere.

An attempt to substitute the above electrode materials for other metallic materials, especially conductive oxides, has been made in view of their characteristics and variations in the characteristics. It is known that, if ITO (InSuO) is used for the electrode material, the hysteresis characteristics of a ferroelectric serving as a capacitive element is improved and, in other words, a square ratio is improved. Since, however, the mechanism of the ferroelectric capacitive element has not yet been clarified specifically, it is not applied to electronic components and the like.

For example, Jpn. Pat. Appln. KOKAI Publication No. 2-248089 discloses using a perovskite conductive oxide film as an electrode to prevent oxygen from diffusing, and Jpn. Pat. Appln. KOKAI Publication No. 4-85878 teaches using ITO as a material for an electrode to prevent oxygen from diffusing at the time of oxidization. Further, Jpn. Pat. Appln. KOKAI Publications Nos. 4-206869 and 4-367211 propose a technique of improving in crystallinity and characteristic by using a conductive oxide such as ITO and RuO as an electrode.

If, however, the above prior art capacitive element is constituted by CVD or the like, there occurs a problem in which the characteristics of the ferroelectrics of the capacitive element deteriorates in a reductive gas containing $H_2$ serving as an atmospheric gas.

A generally-used memory device has a multilayer structure as shown in FIG. 8B. The multilayer structure is based on the CMOS or NMOS structure and includes a ferroelectric formed on the silicon substrate. Such a structure will now be described by way of example.

First, a MOSFET 6, which is representative of a pass gate type transistor, is formed on the silicon substrate to function as a gate of the memory device. Then, a memory capacitor 7 connected to the gate is constituted of a platinum electrode, a ferroelectric thin film, and a platinum electrode, a protection film (passivation layer) 8 is constituted of an insulator formed on $SiO_2$ layers 8a, and a third electrode 10 is formed. $SiO_2$ layer 8a is on the silicon substrate 8b. When the memory capacitor 7 is formed, the MOSFET 6 is exposed to charged particles included in plasma and various contaminations, resulting in problems of shift in threshold voltage Vth or deterioration of sub-threshold characteristics and increase in leak current.

In order to resolve the above problems, anneal treatment is carried out for a predetermined period of time at, for example, 400° to 450° C. in an $N_2$ atmosphere containing 2 to 10% $H_2$. However, the conventional ferroelectric capacitive element is constituted on the basis of an oxide film and precious metal such as platinum which does not form an oxide. In general, an oxide is reduced into a metal atom in the atmospheric gas (reductive gas) of the anneal treatment.

A number of defects in crystal (lack of oxygen molecules, etc.) occur in the vicinity of an interface between the platinum and ferroelectric, and hydrogen molecules ($H_2$) are easy to diffuse in this interface. For this reason, the ferroelectric is reduced and its surface is metallized, with the result that the metallized surface and platinum contact each other at the interface. Since no alloy is formed by the platinum and metal, the contact therebetween is very poor. Therefore, when the third electrode 10 is formed, exfoliation occurs at the interfaces between a via hole of the passivation layer 8, the upper electrode 3, and the lower electrode 5 because of their great stress. This exfoliation not only destroys the memory cells of the memory device but also forms an air layer in the interfaces to adversely affect the electrical characteristics of the device.

None of the foregoing prior art publications refer to any solution to the above problems.

SUMMARY OF THE INVENTION

It is accordingly an object of the present invention to provide a ferroelectric capacitive element capable of being manufactured with high reliability and at low cost, and preventing a ferroelectric film from exfoliating in the process of forming an integrated circuit incorporating the ferroelectric capacitive element and preventing the characteristics of the ferroelectric film from deteriorating.

According to the present invention, there is provided a ferroelectric capacitive element comprising:

a substrate constituted by an insulator;

a lower electrode formed on the substrate and constituted by precious metal;

a ferroelectric thin film formed on the lower electrode and constituted by a ferroelectric;

a conductive oxide film formed on the ferroelectric thin film and having a reduction power which is higher than a reduction power of the ferroelectric thin film; and an upper electrode formed on the conductive oxide film and constituted by at least one metallic material other than precious metal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a view showing a structure of a ferroelectric capacitive element according to a sixth embodiment of the present invention.

DETAILED DESCRIPTION OF THE PREFERRED EMBODIMENTS

Embodiments of the present invention will now be described in detail with reference to the accompanying drawings.

Figure 1:
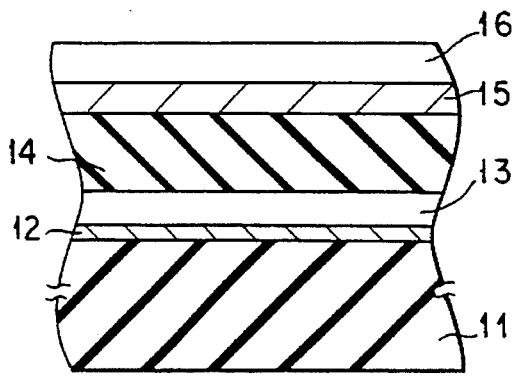
FIG. 1 is a view conceptually showing a structure of a ferroelectric capacitive element according to the present invention.

FIG. 1 conceptually shows a structure of a ferroelectric capacitive element of the present invention.

As shown in FIG. 1, an adhesive layer 12 is formed of titanium or the like on a substrate 11 of a silicon oxide, glass, or the like, and a lower electrode 13 of platinum or the like, a ferroelectric film (ferroelectric thin film) 14, a conductive oxide film 15, and an upper electrode 16 constituted by metallic materials other than precious metal, are formed in this order on the adhesive layer 12. It is preferable that the lower electrode 13 be constituted by non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper is generally used for electrodes of a semiconductor device.

In the ferroelectric capacitive element having the above structure, the adhesive layer 12 and lower electrode 13 are formed at a substrate temperature ranging from 20° to 250° C. by DC magnetron sputtering or RF sputtering, and their thicknesses are each 100 to 300 nm. After that, anneal treatment is carried out for the layer 12 and electrode 13 at a temperature of 500° to 800° C. in an oxygen atmosphere. The ferroelectric film 14 is formed by gel-sol, MOD (Metal Organic Deposition), spin coating, MOCVD (Metal Organic Chemical Vapor Deposition), sputtering, and the like.

The following are materials favorable to the ferroelectric layer 14: a perovskite system, a titanate system such as $BaTiO_3$, (Ba, Sr)$TiO_3$, $SrTiO_3$, pb$TiO_3$(PT), Pb(Zr, Ti)$O_3$(PZT), (Pb, La) (Zr, Ti)$O_3$, a niobate system such as Pb($Mg_{1/3}$, $Nb_{2/3}$)$O_3$, $LiNb_3$, $LiTaO_3$, $KNbO_3$, K(Ta, Nb)$O_3$, a tungsten-bronze system such as (Sr, Ba)$Nb_2O_6$, (Sr, Ba)$_{0.8}$RxNa$_{0.4}$Nb$_2$O$_6$, (Pb, Ba)$Nb_2O_6$, (K, Sr)$Nb_2O_6$, (Pb, K)$Nb_2O_6$, $Ba_2NaNb_5O_{15}$, PBN, KSN, PKN, and BNN, and a Bi(bismuth)-layered perovskite system.

In the process of manufacturing the ferroelectric capacitive element, the heat treatment is carried out in an oxygen atmosphere immediately after the ferroelectric film 14 is formed. While the temperature of the heat treatment is 500° to 700° C. for the PZT-system materials, it is 600° to 850° C. for the Bi-system materials.

The conductive oxide film 15 is then formed, and it is desirable that the materials therefor have a reduction power higher than that of the ferroelectric film 14. The value of the reduction power is an inverse number of an oxidization power. While the oxidization power usually depends upon only the free energy of an oxide, the reduction power is not determined by only the free energy but by experimental combination of factors of (formation enthalpy)—(temperature)×(entropy), temperature, partial pressure of oxygen $O_2$ or hydrogen $H_2$, and structural elements of the ferroelectric film 14 and conductive film 15.

If the perovskite system including Pb such as PZT, PLZT, PBN, PKN, Pb(MgNb)O and PTO is used as a material for the ferroelectric oxide film 14, the following substances are favorable to the conductive oxide film 15: ZnO, ZnO containing 0.5 to 5 atomic % aluminum, $SnO_2$, $In_2O_3$, $In_2O_3$ containing 5 to 30% SnO, $TiO_2$, $ZrO_2$, conductive cubic system copper oxide $Cu_6O_8$. MCl (MCl is In, Y, substitution of other trivalent metal ion, an oxide such as $Ag_5Pb_2O_6$, etc.), (St, La)$CuO_2$, PrBaCuO, $YBa_2Cu_3O_{7-x}$, and the like.

If the Bi-layered perovskite system such as $LiNbO_3$, $LiTaO_3$, (Sr, Ba)NbO, and (Pb, K)$Nb_2O_6$ is used as a material for the ferroelectric oxide film 14, since the forming temperature of the film 14 is greatly increased, the following substances are favorable to the film 15: ZnO, $SnO_2$, $InO_3$, ITO, $ZnO_2$, $YBCORuO_2$, $ReO_2$, semiconducting ferroelectrics (SrTaO, $BaSrTiO_3$), Bi system superconductor (Bi-2212, $Bi_2Sr_2CaCu_2O_8$, Bi-2201, Bi-2223), $Tl_2Ba_2Ca_{1-x}Nd_xCu_2O_y$, and the like.

The conductive oxide film 15 is formed at a forming temperature which is equal to or 100° to 200° C. lower than that of the ferroelectric film 14, and the upper electrode 16 is formed on the conductive oxide film 15. The electrode 16 is obtained from the material other than precious metal such as Pt, Ag and Au, that is, the material such as Al, Al alloy, AlSi, AlNi, Ni, Ni alloy and Cu alloy, using DC magnetron sputtering.

In the above-described structure of the ferroelectric capacitive element, the metal oxide of the conductive oxide film 15 is only reduced in the anneal treatment in a gaseous atmosphere of ($H_2$+$N_2$), $N_2$ or Ar, that is, in the anneal treatment at a temperature of 400° to 500° C. in a relatively reducible gaseous atmosphere not including $O_2$, and the characteristics of the ferroelectric film 14 does not deteriorate. The reduction of the conductive oxide film 15 increases its conductivity. The Al alloy is originally likely to constitute conductive $Al_2O_3$ at the interface and, even if it is partially reduced, no problems occur. It is thus confirmed that the ferroelectric film 14 neither deteriorates in characteristics nor exfoliates even in the reductive atmosphere.

Figure 2:
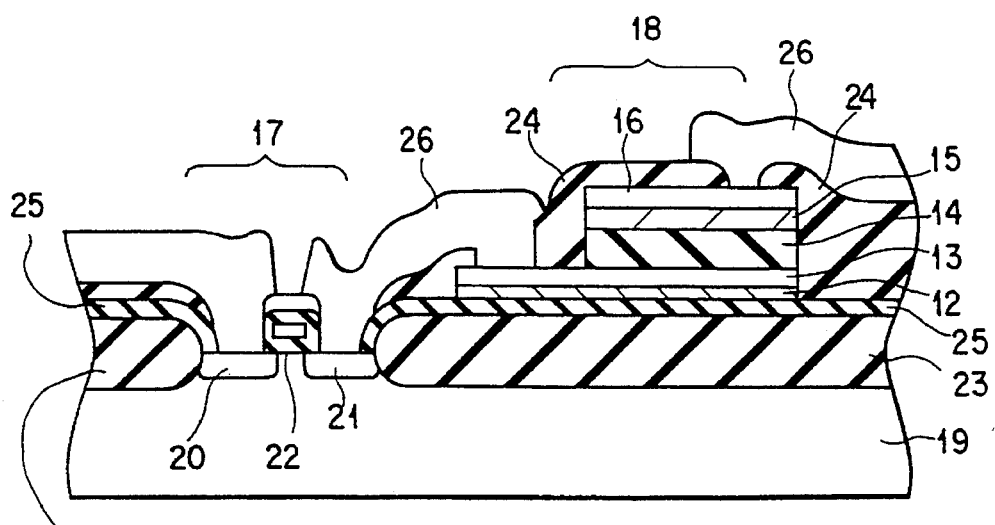
FIG. 2 is a view schematically showing a structure of a ferroelectric memory device incorporating both a MOSFET and a ferroelectric capacitive element according to a first embodiment of the present invention.

FIG. 2 schematically shows a structure of a ferroelectric memory device incorporating both a MOSFET and a ferroelectric capacitive element according to a first embodiment of the present invention. In FIG. 2, the same components as those of the ferroelectric capacitive element shown in FIG. 1 are indicated by the same reference numerals, and their descriptions are omitted.

Figure 8A:
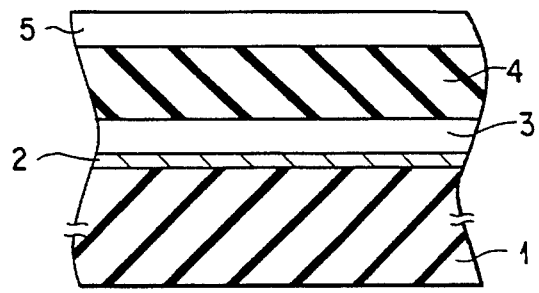
FIGS. 8A and 8B are views showing a structure of a conventional capacitive element using a ferroelectric thin film.
Figure 8B:
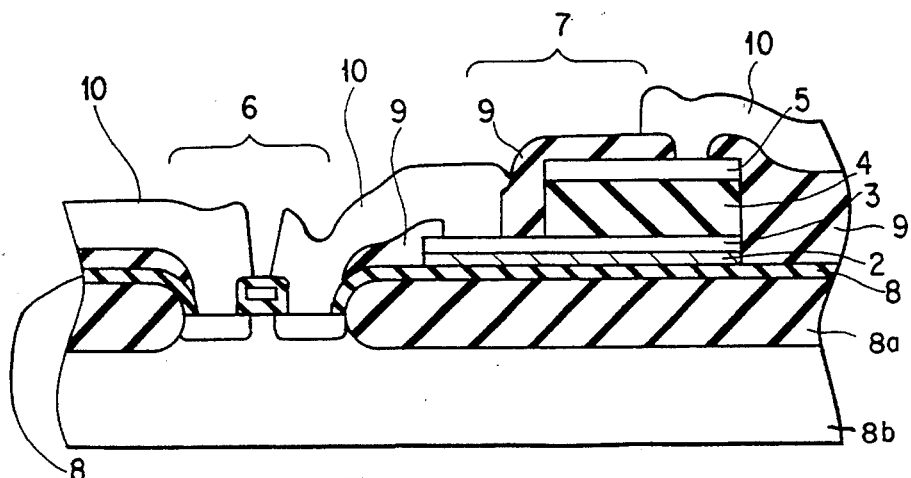

The ferroelectric memory device shown in FIG. 2 is mainly includes a MOSFET 17 and a ferroelectric capacitive element 18. The MOSFET 17 has a source 20, a drain 21 and a gate 22 formed on a substrate 19 of Si or GaAs. A LOCOS (Local Oxidation of Silicon) region 23 is formed on the silicon substrate 1a to electrically isolate the source, drain and gate from the other regions, and is covered with a passivation layer 25 of PSG (Phospho-Silicate Glass) or the like. After that an interlayer 24 (a in FIG. 8B)is formed of an oxide film of SOG (Spin On Glass), PSG or the like, $Al_2O_3$, $S_3N_4$, $P-SiO_2$ formed in plasma, and an oxide film formed by LPCVD (Low Pressure CVD) alone or in combination.

Part of the upper electrode 16 of the ferroelectric capacitive element 18 formed on the passivation layer 25, is opened such that the interlayer film 24 is exposed. This opening is then removed by RIE (Reactive Ion Etching), ion milling etching, wet etching or the like. Thereafter, a third electrode 26 is formed of Al, Al alloy, AlSi, AlNi, Ni, Ni alloy, AlCu alloy, Cu, Cu alloy, Ti, Ta, TiN, TiW, etc. alone or in combination.

After that, the heat treatment is carried out at a temperature of 400° to 500° C. in an atmosphere of mixture gas of $H_2+N_2$ in order to improve the characteristics of the MOSFET 17. In this heat treatment, the conductive oxide film 15 is reduced prior to reduction of the ferroelectrics and interface, and $Al_2O_3$ formed at the interface of the upper electrode 16 of Al or the like, is not easily reduced. Therefore, the upper electrode 16, conductive oxide film 15 and ferroelectric film 14 do not deteriorate in characteristics, nor do they exfoliate.

Figure 3:
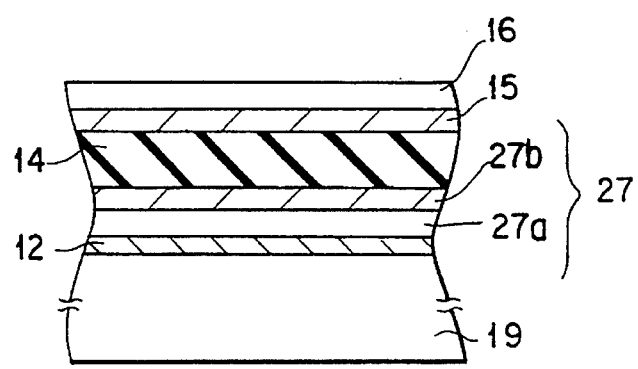
FIG. 3 is a view showing a structure of a ferroelectric capacitive element according to a second embodiment of the present invention.

FIG. 3 shows a structure of a ferroelectric capacitive element according to a second embodiment of the present invention, and the ferroelectric capacitive element is similar to that of FIG. 2. In FIG. 3, the same components as those of the ferroelectric capacitive element shown in FIG. 2 are denoted by the same reference numerals and their descriptions are omitted.

The ferroelectric capacitive element shown in FIG. 3 includes a lower electrode 27 (corresponding to the lower electrode 13 shown in FIG. 2) having two layers. One of them is a precious metal layer 27a formed of Pt, Pd, Au, etc., and the other is a conductive oxide film (CO) 27b formed on the layer 27a. Since the layer 27a is formed of precious metal, it is resistible to heat treatment and heat treatment in an oxygen atmosphere. As in the ferroelectric capacitive element shown in FIG. 2, the ferroelectric film 14, conductive oxide film 15 and upper electrode 16 are formed in this order on the lower electrode 27.

The conductive oxide film 27b needs to be resistant to a temperature which is higher than that of the heat treatment for converting the ferroelectric layer 14 to a ferroelectric crystal layer, and the favorable materials therefor are as follows: $TiO_2$, $ZnO_2$, $RuO_2$, $ReO_2$, $(Sr, La)CuO_2$, $PrBaCuO$, $YBa_2Cu_3O_{7-x}$, Bi-system super-conductor (Bi-2212, $Bi_2Sr_2CaCu_2O_8$, Bi-2201, Bi-2223, etc.), $Tl_2Ba_2Ca_{1-x}Nd_xCu_2O_y$, and the like.

Figure 4:
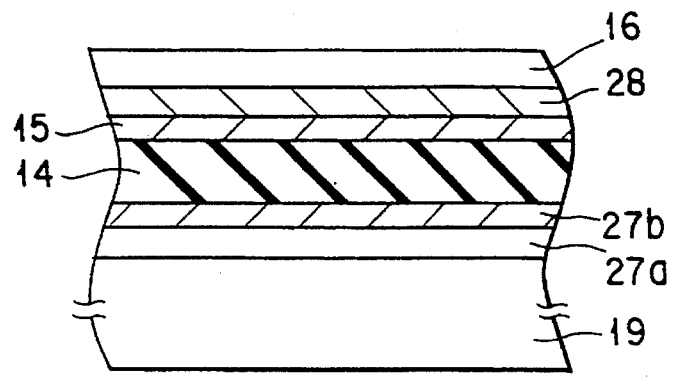
FIG. 4 is a view showing a structure of a ferroelectric capacitive element according to a third embodiment of the present invention.

FIG. 4 is a view showing a structure of a ferroelectric capacitive element according to a third embodiment of the present invention.

The ferroelectric capacitive element of the third embodiment is basically the same as that of the second embodiment, except that a refractory metal film 28 is formed on the conductive oxide film 15. If the materials for the film 28 are selected properly, various materials can be applied to the upper electrode 16. If $Bi_2Sr_2CaCu_2O_8$ is used for the conductive oxide film 27b, a Bi-layered compound is used for the ferroelectric film 14, and an Al-doped ZnO is used for the conductive oxide film 15, TiN, Ti, TiW, or the like can be used for the refractory metal film 28, and Al, AlSi, AlCuSi, or the like can be used for the upper electrode 16. TiN, Ti and TiW are effective in forming an adhesive layer and in connecting a third electrode of the upper electrode 16 and refractory metal film 28 to the other elements.

Figure 5:
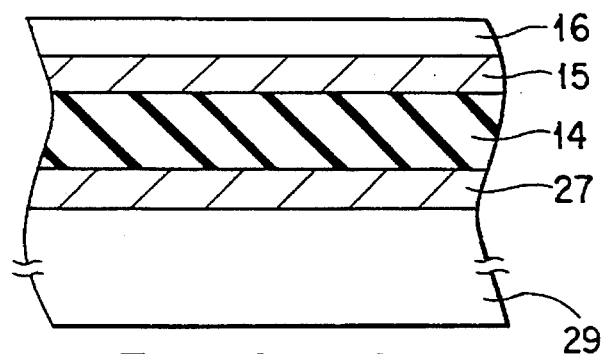
FIG. 5 is a view showing a structure of a ferroelectric capacitive element according to a fourth embodiment of the present invention.

FIG. 5 shows a structure of a ferroelectric capacitive element according to a fourth embodiment of the present invention. The ferroelectric capacitive element of the fourth embodiment is basically the same as that of the second embodiment, except that a lower electrode 27 is constituted by a conductive oxide film only. In the ferroelectric capacitive element shown in FIG. 5, for example, the lower electrode 27, ferroelectric film 14, conductive oxide film 15, and upper electrode 16 are formed of $Bi_2Sr_2CaCu_2O_7$, a Bi-layered compound, Al-doped ZnO, and Al compound, respectively.

If the lower electrode 27 is formed on a substrate 29 of $SiO_2$ or the like at a relatively high temperature when it is not rendered in a good crystal condition, it becomes metallic due to free carriers therein and increases in stickiness and crystallinity.

No cracks occur in the Bi-system ferroelectric film 14 even though it is formed on the substrate 29 of $SiO_2$, and a remarkably flat polycrystal can be obtained even after heat treatment is carried out at a high temperature of 800° to 850° C. If a Bi-system superconductor is used for the lower electrode 27 and a Bi-layered compound is used for the ferroelectric film 14, the most effective results can be obtained.

Figure 6:
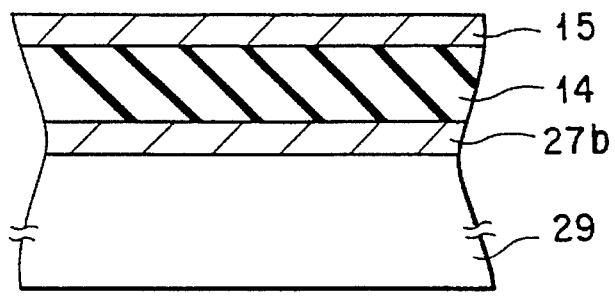
FIG. 6 is a view showing a structure of a ferroelectric capacitive element according to a fifth embodiment of the present invention.

FIG. 6 shows a structure of a ferroelectric capacitive element according to a fifth embodiment of the present invention. The ferroelectric capacitive element of the fifth embodiment is basically the same as that of the second embodiment, except that an equivalent for the foregoing upper electrode 16 of metal is not formed, and a ferroelectric film 14 is interposed between conductive oxide films 27b and 15.

FIG. 7 shows a structure of a ferroelectric capacitive element according to a sixth embodiment of the present invention. In FIG. 7, the same components as those of the ferroelectric capacitive element shown in FIG. 2 are indicated by the same reference numerals, and their descriptions are omitted.

According to the sixth embodiment, a protection layer 24 is formed by SOG (Spin On Glass), BPSG (Boron-doped phospho-Silicate Glass), $P-SiO_2$, etc. on the structure of the fifth embodiment including the lower electrode (conductive oxide film 27b) 27, ferroelectric film 14 and upper electrode (conductive oxide film) 15. After that, a contact hole is formed so as to partially expose the drain 21, lower electrode 27, and upper electrode 15, and a third electrode 26 for connecting the drain 21 and lower electrode 27 or removing the upper electrode 15, is formed.

Since the lower electrode 27, ferroelectric film 14 and upper electrode 15 of the ferroelectric capacitive element according to the sixth embodiment are all formed of oxides, the element is very adherent to $SiO_2$ of the substrate 29 and stable for heat treatment (containing the atmospheric gas). The electrodes and wiring are then constituted of, e.g., aluminum in the normal manufacturing process, thereby completing a memory device.

As described above, the ferroelectric capacitive element of the above embodiments prevents defects in crystal and exfoliation of films caused when the element is formed on the same substrate, together with the other driving element such as a MOSFET, and can be manufactured with high reliability and at low cost. Consequently, a high-density nonvolatile memory can be obtained from the ferroelectric capacitive element with high reliability and at low cost.

Furthermore, in the ferroelectric capacitive element of the present invention, a conductive oxide having a reduction power higher than that of an oxide film which forms the ferroelectric film in a temperature region in the electrode forming process and/or the electrode alloying process, is formed between a metallic electrode and an electrode obtained from a material other than precious metal, thereby preventing the characteristics of the ferroelectric film from deteriorating and preventing it from exfoliating because of heat generated from the heat treatment and gas of the reductive atmosphere in the manufacturing process.

The ferroelectric capacitive element according to the present invention can be manufactured with high reliability and at low cost and has a structure capable of preventing a ferroelectric film from exfoliating and preventing the characteristics thereof from deteriorating in the process of forming an integrated circuit incorporating the ferroelectric capacitive element.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A ferroelectric capacitive element comprising:
   a substrate constituted by an insulator;
   a lower electrode formed on said substrate and constituted by precious metal;
   a ferroelectric thin film formed on said lower electrode and constituted by a ferroelectric;
   a conductive oxide film formed on said ferroelectric thin film and having a reduction power which is higher than a reduction power of said ferroelectric thin film; and
   an upper electrode formed on said conductive oxide film and constituted by at least one metallic material other than precious metal.

2. The ferroelectric capacitive element according to claim 1, wherein said ferroelectric thin film is formed by any one of by gel-sol, MOD (Metal Organic Deposition), spin coating, MOCVD (Metal Organic Chemical Vapor Deposition), sputtering, and the like.

3. The ferroelectric capacitive element according to claim 1, wherein said ferroelectric thin film is formed of any one of a perovskite system material, a titanate system material such as $BaTiO_3$, $(Ba, Sr)TiO_3$, $SrTiO_3$, $PbTiO_3$(PT), $Pb(Zr, Ti)O_3$(PZT) and $(Pb, La)(ZrTi)O_3$, a niobate system material such as $pb(Mg_{1/3}, Nb_{2/3})O_3$, $LiNb_3O$, $LiTaO_3$, $KNbO_3$ and $K(Ta, Nb)O_3$, a tungsten-bronze system material such as $(Sr, Ba)Nb_2O_6$, $(Sr, Ba)_{0.8}Rx Na_{0.4}Nb_2O_6$, $(Pb, Ba)Nb_2O_6$, $(K, Sr)Nb_2O_6$, $(Pb, K)Nb_2O_6$, $Ba_2NaNb_5O_{15}$, PBN, KSN, PKN and BNN, and a Bi-layered perovskite system.

4. The ferroelectric capacitive element according to claim 1, wherein said conductive oxide film is formed of any one of ZnO, ZnO containing 0.5 to 5 atomic % aluminum, $SnO_2$, $In_2O_3$, $In_2O_3$ containing 5 to 30% SnO, $TiO_2$, $ZrO_2$, conductive cubic system copper oxide $Cu_6O_8$. MCl (MCl is In, Y, substitution of other trivalent metal ion, an oxide such as $Ag_5Pb_2O_6$, etc.), $(St, La)CuO_2$, PrBaCuO, $YBa_2Cu_3O_{7-x}$ when said ferroelectric thin film includes a perovskite system material containing Pb such as PZT, PLZT, PBN, PKN, Pb(MgNb)O and PTO.

5. The ferroelectric capacitive element according to claim 1, wherein said conductive oxide film is formed of any one of ZnO, $SnO_2$, $InO_3$, ITO, $ZnO_2$, YBCO, $RuO_2$, rhenium oxide, semiconducting ferroelectrics such as SrTaO, $BaSrTiO_3$, Bi-system superconductor such as Bi-2212, $Bi_2Sr_2CaCu_2O_8$, Bi-2201, and Bi-2223, and $Tl_2Ba_2Ca_{1-x}Nd_xCu_2O_y$.

6. The ferroelectric capacitive element according to claim 1, wherein said conductive oxide film is formed at a forming temperature which is equal to or 100° to 200° C. lower than a forming temperature of said ferroelectric thin film.

7. A ferroelectric capacitive element comprising:
   a substrate constituted by an insulator;
   a first lower electrode formed on said substrate and constituted by precious metal;
   a second lower electrode formed on said first lower electrode and constituted by a first conductive oxide film;
   a ferroelectric thin film formed on said second lower electrode and constituted by a ferroelectric;
   a second conductive oxide film formed on said ferroelectric thin film and having a reduction power which is higher than a reduction power of said ferroelectric thin film; and
   an upper electrode formed on said second conductive oxide film and constituted by at least one metallic material other than precious metal.

8. The ferroelectric capacitive element according to claim 7, wherein said second conductive oxide film is formed of any one of $TiO_2$, $ZnO_2$, $RuO_2$, $ReO_2$, $(Sr, La)CuO_2$, PrBaCuO, $YBa_2Cu_3O_{7-x}$, Bi-system conductor such as Bi-2212, $Bi_2Sr_2CaCu_2O_8$, Bi-2201, and Bi-2223, and $Tl_2Ba_2Ca_{1-x}Nd_xCu_2O_y$.

9. A ferroelectric capacitive element comprising:
   a substrate constituted by an insulator;
   a first lower electrode formed on said substrate and constituted by precious metal;
   a second lower electrode formed on said first lower electrode and constituted by a first conductive oxide;
   a ferroelectric thin film formed on said second lower electrode and constituted by a ferroelectric;
   a second conductive oxide film formed on said ferroelectric thin film and having a reduction power which is higher than a reduction power of said ferroelectric thin film;
   a refractory metal film formed on said second conductive oxide film and constituted by adhesive precious metal having a high melting point; and
   an upper electrode formed on said refractory metal film and constituted by at least one metallic material other than precious metal.

10. The ferroelectric capacitive element according to claim 9, wherein said second conductive oxide film is formed of Al-doped ZnO, said refractory metal film is formed of one of TiN, Ti and TiW, and said upper electrode is formed of one of Al, AlSi, and AlCuSi, when said second first conductive oxide film is formed of $Bi_2Sr_2CaCu_2O_8$ and said ferroelectric thin film is formed of a Bi-layered compound.

11. A ferroelectric capacitive element comprising:

a substrate constituted by an insulator;

a lower electrode formed on said substrate and constituted by precious metal;

a second lower electrode formed on said first lower electrode and constituted by a first conductive oxide film;

a ferroelectric thin film formed on said lower electrode and constituted by a ferroelectric;

a second conductive oxide film formed on said ferroelectric thin film and having a reduction power which is higher than a reduction power of said ferroelectric thin film; and an upper electrode formed on said second oxide film and constituted by at least one metallic material other than precious metal.

12. The ferroelectric capacitive element according to claim 11, wherein said lower electrode is formed of $Bi_2Sr_2CaCu_2O_7$, said ferroelectric thin film is formed of a Bi-layered compound, said second conductive oxide film is formed of Al-doped ZnO, and said upper electrode is formed of an aluminum compound.

* * * * *